(12) United States Patent
Tainaka et al.

(10) Patent No.: US 12,270,933 B2
(45) Date of Patent: Apr. 8, 2025

(54) RADAR APPARATUS

(71) Applicant: DENSO CORPORATION, Kariya (JP)

(72) Inventors: Yusuke Tainaka, Kariya (JP); Akira Shintai, Kariya (JP); Shinji Kawano, Kariya (JP)

(73) Assignee: DENSO CORPORATION, Kariya (JP)

( * ) Notice: Subject to any disclaimer, the term of this patent is extended or adjusted under 35 U.S.C. 154(b) by 465 days.

(21) Appl. No.: 17/646,786

(22) Filed: Jan. 3, 2022

(65) Prior Publication Data

US 2022/0128650 A1  Apr. 28, 2022

Related U.S. Application Data

(63) Continuation of application No. PCT/JP2020/023021, filed on Jun. 11, 2020.

(30) Foreign Application Priority Data

Jul. 5, 2019  (JP) .................. 2019-125992

(51) Int. Cl.
G01S 7/03 (2006.01)
H01Q 1/22 (2006.01)
H01Q 9/04 (2006.01)

(52) U.S. Cl.
CPC ........... *G01S 7/032* (2013.01); *H01Q 1/2283* (2013.01); *H01Q 9/0407* (2013.01)

(58) Field of Classification Search
None
See application file for complete search history.

(56) References Cited

U.S. PATENT DOCUMENTS

| | | |
|---|---|---|
| 2003/0223212 A1 | 12/2003 | Hosokawa et al. |
| 2005/0259702 A1 | 11/2005 | Kubota et al. |
| 2012/0018524 A1* | 1/2012 | Loi .......... H01Q 9/30 235/492 |
| 2017/0347479 A1 | 11/2017 | Ando |
| 2018/0110158 A1* | 4/2018 | Talpallikar .......... H05K 9/0032 |
| 2018/0359884 A1 | 12/2018 | Yuasa et al. |

FOREIGN PATENT DOCUMENTS

| | | |
|---|---|---|
| JP | 8-15357 A | 1/1996 |
| JP | 10-117088 A | 5/1998 |
| JP | 2003-145681 A | 5/2003 |
| JP | 2003-298004 A | 10/2003 |
| JP | 2005-124882 A | 5/2005 |
| JP | 2005-322299 A | 11/2005 |
| JP | 2009-56714 A | 3/2009 |
| JP | 2014179515 A * | 9/2014 |
| JP | 2018-63159 A | 4/2018 |
| JP | 6379319 B1 | 8/2018 |

OTHER PUBLICATIONS

JP2014179515 translation (Year: 2014).*

* cited by examiner

*Primary Examiner* — Whitney Moore
(74) *Attorney, Agent, or Firm* — MASCHOFF BRENNAN

(57) ABSTRACT

In a radar apparatus, a high-frequency integrated circuit is mounted to a board, and a shielding case encloses the high-frequency integrated circuit. A radio-absorbing and heat-dissipative gel is arranged to cover at least part of the high-frequency integrated circuit and to be in contact with the shielding case.

10 Claims, 4 Drawing Sheets

RADAR APPARATUS

CROSS-REFERENCE TO RELATED APPLICATION

The present application is a bypass continuation application of a currently pending international application No. PCT/JP2020/023021 filed on Jun. 11, 2020 designating the United States of America, the entire disclosure of which is incorporated herein by reference, the international application being based on and claims the benefit of priority from Japanese Patent Application No. 2019-125992 filed on Jul. 5, 2019.

TECHNICAL FIELD

The present disclosure relates to radar apparatuses.

BACKGROUND

Radar apparatuses typically include a high-frequency integrated circuit (IC), such as a Monolithic Microwave IC (MMIC). The high-frequency IC is typically enclosed by a shielding case.

SUMMARY

A radar apparatus according to one aspect includes a radio-absorbing and heat-dissipative gel arranged to cover at least part of a high-frequency integrated circuit and to be in contact with a shielding case.

DETAILED DESCRIPTION OF EMBODIMENTS

Figure 1:
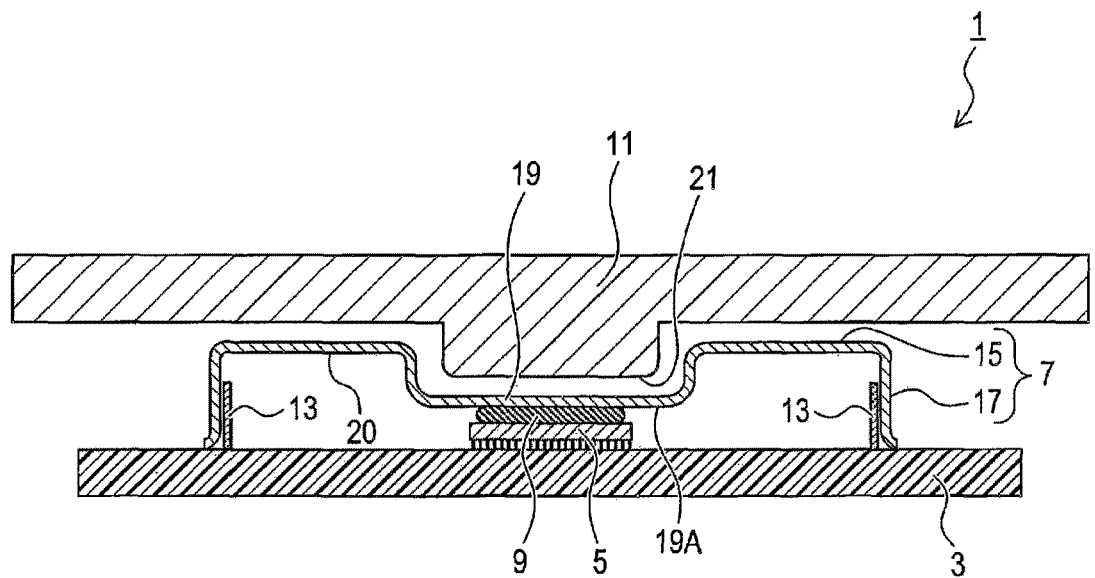
FIG. 1 is a side cross-sectional view illustrating a configuration of a radar apparatus according to the first embodiment.

Some technologies related to a shielding case of a radar apparatus are disclosed in Japanese Patent Application Publication No. 2018-207040

The inventors of the present disclosure have studied in detail such a radar apparatus equipped with a high-frequency IC enclosed in a shielding case and accordingly have found a problem.

Specifically, a larger part of radio waves emitted from one or more transmitting channels of the high-frequency IC enclosed in the shielding case is diffracted to be inputted to one or more receiving channels of the high-frequency IC enclosed in the shielding case. This may result in a higher level of a noise floor (floor noise) around the high-frequency IC as compared to the level of received echoes, resulting in a signal-to-noise ratio (S/N ratio) of the radar apparatus being lower. The lower S/N ratio of the radar apparatus may result in a shorter distance measured by the radar apparatus.

For reducing the level of the noise floor, the inventors have considered a first idea that a radio-wave absorber be mounted to an inner surface of the shielding case.

Additionally, it is necessary to dissipate heat generated from the high-frequency IC in the shielding case. We then have considered a second idea that a heat dissipation gel be filled in a space between the high-frequency IC and the shielding case.

When implementing the above first and second ideas so that the heat dissipation gel is filled in the space between the high-frequency IC and the shielding case, the inventors have found that the radio-wave absorber needs be mounted to a portion of the shielding case that is far away from the high-frequency IC. Because the above diffraction of the radio waves is mainly generated in and around the high-frequency IC, the radio-wave absorber mounted at the portion of the shielding case, which is far away from the high-frequency IC, may not sufficiently reduce the noise floor.

One aspect of the present disclosure preferably provides radar apparatuses, each of which is capable of both dissipating heat generated from a high-frequency IC and reducing a noise floor due to the high-frequency IC.

The present disclosure provides a radar apparatus according to an exemplary measure. The radar apparatus according to the exemplary measure includes a board, a high-frequency integrated circuit mounted to the board, a shielding case that encloses the high-frequency integrated circuit, and a radio-absorbing and heat-dissipative gel arranged to cover at least part of the high-frequency integrated circuit and to be in contact with the shielding case.

The radar apparatus according to the exemplary measure includes the radio-absorbing and heat-dissipative gel. The radio-absorbing and heat-dissipative gel is arranged to cover at least part of the high-frequency integrated circuit and to be in contact with the shielding case. This configuration of the radar apparatus enables heat generated from the high-frequency integrated circuit to be transferred to the shielding case through the radio-absorbing and heat-dissipative gel. The radar apparatus according to the one inventive aspect therefore makes it possible to efficiently dissipate heat generated from the high-frequency integrated circuit.

The radio-absorbing and heat-dissipative gel additionally absorbs radio waves generated by the high-frequency integrated circuit. Because the radio-absorbing and heat-dissipative gel covers at least part of the high-frequency integrated circuit, the radio-absorbing and heat-dissipative gel more efficiently absorbs the radio waves generated by the high-frequency integrated circuit. The radar apparatus according to the exemplary measure therefore makes it possible to reduce the noise floor due to the high-frequency integrated circuit.

The following describes exemplary embodiments of the present disclosure with reference to the accompanying drawings.

First Embodiment

Figure 2:
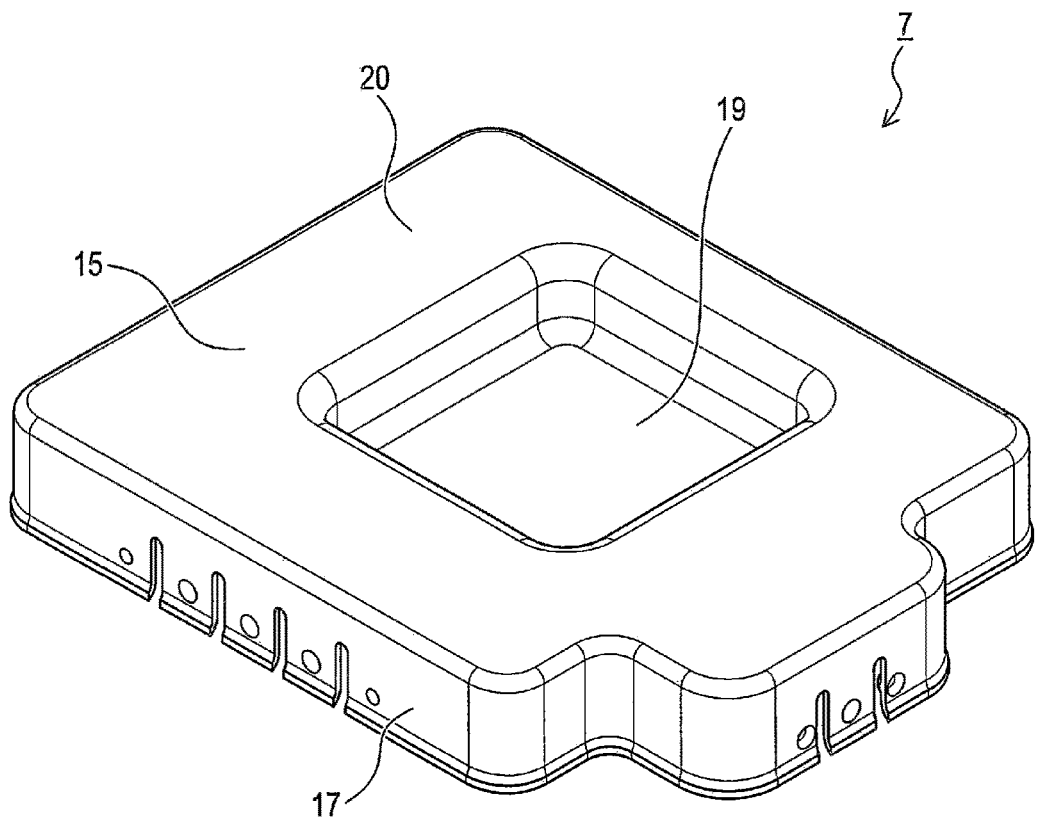
FIG. 2 is a perspective view illustrating a configuration of a shielding case as viewed from a side where the metallic housing is disposed.
Figure 3:
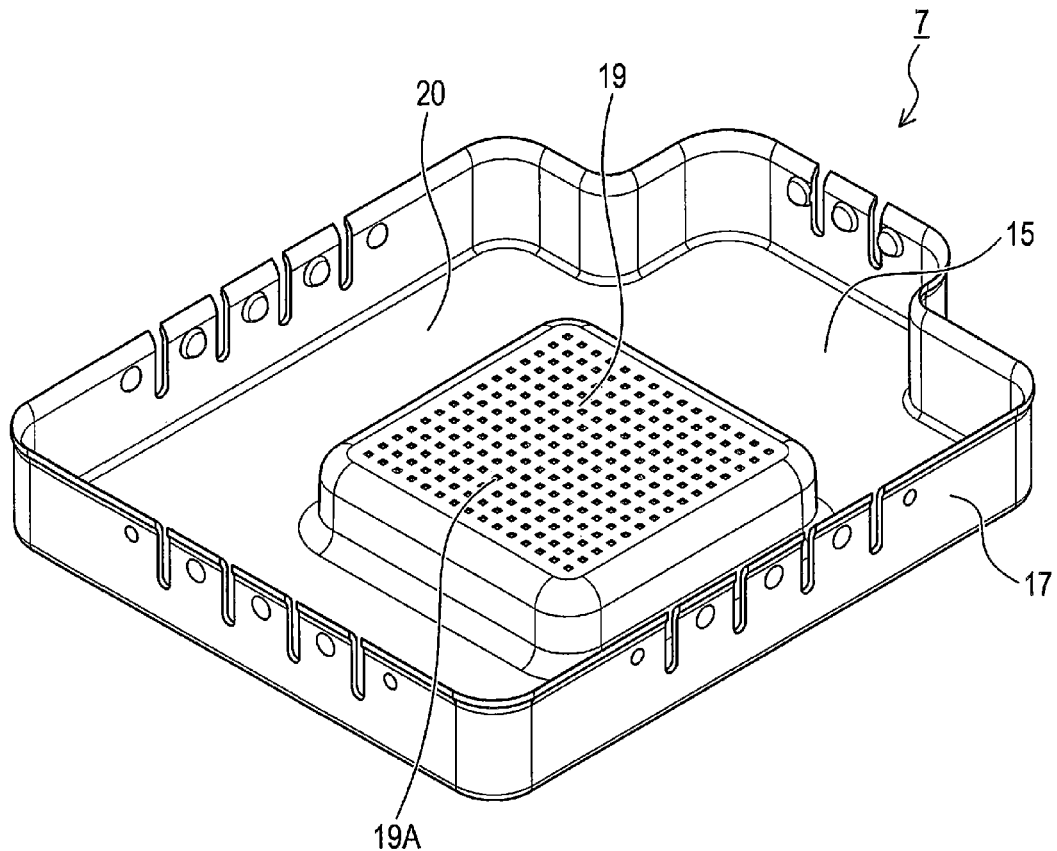
FIG. 3 is a perspective view illustrating the configuration of the shielding case as viewed from a side where the board is disposed.

The following describes an exemplary configuration of a radar apparatus 1 according to the first embodiment with reference to FIGS. 1 to 3.

The radar apparatus 1 is, for example, designed as a vehicular radar apparatus used to be installed in a vehicle.

The radar apparatus 1, which is configured as a millimeter-wave radar, is used for an advanced driver assist system or an autonomous drive system.

Referring to FIG. 1, the radar apparatus 1 includes a board 3, a Monolithic Microwave Integrated Circuit (MMIC) 5, a shielding case 7, a radio-absorbing and heat-dissipative gel 9, and a metallic housing 11.

The MMIC 5, which serves as a high-frequency IC 5, is mounted on the board 3. The board 3 has a case holder 13 mounted thereon. The case holder 13 is comprised of a metallic wall structure arranged to surround the MMIC 5.

Referring to FIGS. 1 to 3, the shielding case 7 is comprised of a box-shaped member with an opening side located to be adjacent to the board 3. Specifically, the shielding case 7, which is made of metal, has a top wall 15 and a side wall portion 17. The top wall 15 is arranged to face the board 3, and the side wall portion 17 extends from the entire outer edge of the top wall 15 toward the board 3 so as to be mounted on the board 3. The above arrangement of the top wall 15, the side wall portion 17, and the board 3 define a space therebetween.

As illustrated in FIG. 1, the case holder 17 is fitted in the side wall portion 17, so that the shielding case 7 is mounted to the substrate 3. The shielding case 7 mounted to the substrate 3 results in enclosing the MMIC 5. The shielding case 7 works to prevent exogenous noise from entering into the shielding case 7.

The shielding case 7 has a protrusion portion 19 of the top wall 15; the protrusion portion 19 protrudes toward the MMIC 5. The protrusion portion 19 is located at the center of the top wall 15. The protrusion portion 19 is overlapped with the MMIC 5 as viewed in the thickness direction of the board 3. The area of the protrusion portion 19 encompasses the MMIC 5 as viewed in the thickness direction of the board 3.

The protrusion portion 19 has a surface 19A that faces the MMIC 5; the surface 19A will be referred to as a gel contact surface 19A. The gel contact surface 19A has a substantially flat shape. In particular, the gel contact surface 19A has a level Rz of surface roughness that is more than or equal to 10 and less than or equal to 1000. A stylus type surface roughness tester is used to measure the level Rz of surface roughness of the gel contact surface 19A.

The gel contact surface 19A and the MMIC 5 are arranged to define a clearance therebetween.

The top wall 15 has the gel contact surface 19A of the protrusion portion 19, and also has a periphery 20 defined as the remaining portion of the top wall 15 except for the protrusion portion 19. The gel contact surface 19A is located to be closer to the board 3 than the periphery 20 is.

The radio-absorbing and heat-dissipative gel 9 is filled in the clearance between the gel contact surface 19A and the MMIC 5, so that the radio-absorbing and heat-dissipative gel 9 is in contact with the MMIC 5. The MMIC 5 has a surface that faces the shielding case 7, and the radio-absorbing and heat-dissipative gel 9 covers at least a major part of the surface, which faces the shielding case 7, of the MMIC 5. In particular, the radio-absorbing and heat-dissipative gel 9 according to the first embodiment covers the whole part of the surface, which faces the shielding case 7, of the MMIC 5.

The radio-absorbing and heat-dissipative gel 9 is also in contact with the gel contact surface 19A. As described above, the level Rz of surface roughness of the gel contact surface 19A is within the range from 10 to 1000 inclusive.

The radio-absorbing and heat-dissipative gel 9 has a level of thermal conductivity which is preferably set to be more than or equal to 0.1 W/(m·K), and more preferably more than or equal to 1 W/(m·K).

The radio-absorbing and heat-dissipative gel 9 is made of one or more predetermined materials. If a test sample, which has the thickness of 1 mm, is made using the same materials as those of the radio-absorbing and heat-dissipative gel 9, and the amount of electromagnetic shielding of the test sample is measured using electromagnetic waves whose wavelength is 4 mm, the measured amount of electromagnetic shielding of the test sample is, for example, more than or equal to 1 dB, and preferably more than or equal to 10 dB.

The radio-absorbing and heat-dissipative gel 9 is comprised of, for example, a mixture of a resin member, a heat dissipation filler, and a radio-wave absorption filler. The resin member consists of, for example, silicone-type resin. The heat dissipation filler is composed of, for example, a thermally conductive powder, such as an oxidized powder, a nitride powder, a carbide power, or another material powder. The oxidized powder can be made of alumina, the nitride powder can be made of boron nitride, and the carbide power can be made of silicon carbide. The heat dissipation filler can be composed of one type of material or a mixture of several types of material.

The radio-wave absorption filler is composed of, for example, a magnetic powder, such as a ferrite powder, a carbonyl iron powder, a magnetic metallic powder having a flat shape, or another material powder. The radio-wave absorption filler can be composed of one type of material or a mixture of several types of material.

The level of thermal conductivity of the radio-absorbing and heat-dissipative gel 9 becomes higher as the amount of heat dissipation filler contained in the radio-absorbing and heat-dissipative gel 9 becomes larger. The amount of electromagnetic shielding of the radio-absorbing and heat-dissipative gel 9 becomes larger as the amount of radio-wave absorption filler contained in the radio-absorbing and heat-dissipative gel 9 becomes larger.

The radio-absorbing and heat-dissipative gel 9 has the thickness of, for example, larger than or equal to 0.1 mm and smaller than or equal to 2.0 mm. For example, coating the mixture of materials constituting the radio-absorbing and heat-dissipative gel 9 on the MMIC 5 or the gel contact surface 19A enables the radio-absorbing and heat-dissipative gel 9 to be formed in the clearance between the MMIC 5 and the gel contact surface 19A.

The metallic housing 11 constitutes a part of a housing of the radar apparatus 1. The metallic housing 11 is located at the outer side of the shielding case 7. The metallic housing 11 located at the outer side of the shielding case 7 means that the metallic housing 11 is located across the shielding case 7 from the MMIC 5. The metallic housing 11 and the shielding case 7 define a clearance therebetween.

The metallic housing 11 has a protrusion portion 21 that protrudes toward the shielding case 7. The protrusion portion 21 is overlapped with the protrusion portion 21 as viewed in the thickness direction of the board 3.

The radar apparatus 1 configured set forth above achieves the following advantageous benefits.

The radar apparatus 1 includes the radio-absorbing and heat-dissipative gel 9. The radio-absorbing and heat-dissipative gel 9 covers at least part of the MMIC 5, and is in contact with the shielding case 7. The radio-absorbing and heat-dissipative gel 9 enables heat generated from the MMIC 5 to be transferred to the shielding case 7 through the radio-absorbing and heat-dissipative gel 9. This therefore makes it possible for the radar apparatus 1 to efficiently dissipate heat generated from the MMIC 5 through the radio-absorbing and heat-dissipative gel 9.

The radio-absorbing and heat-dissipative gel 9 additionally absorbs radio waves generated by the MMIC 5. Because the radio-absorbing and heat-dissipative gel 9 covers at least part of the MMIC 5, the radio-absorbing and heat-dissipative gel 9 more efficiently absorbs the radio waves generated by the MMIC 5, making it possible for the radar apparatus 1 to reduce a noise floor due to the MMIC 5.

The shielding case 7 has the protrusion portion 19 that is located to face the MMIC 5. The protrusion portion 19 protrudes toward the MMIC 5, so that the radio-absorbing and heat-dissipative gel 9 abuts the protrusion portion 19. This results in the thickness of the radio-absorbing and heat-dissipative gel 9 being thinner as compared with a case where the shielding case 7 has no protrusion portion 19. This therefore makes it possible for the radar apparatus 1 to more efficiently dissipate heat generated from the MMIC 5.

The shielding case 7 has the periphery 20 around the protrusion portion 19. The periphery 20 is configured such that a distance between the periphery 20 and the board 3 is longer than a distance between the protrusion portion 19 and the board 3. This enables taller components to be mounted on a portion of the board 3; the portion of the board 3 faces the periphery 20 of the shielding case 7.

The level Rz of surface roughness of the gel contact surface 19A is within the range from 10 to 1000 inclusive. This results in stronger adhesion of the radio-absorbing and heat-dissipative gel 9 to the gel contact surface 19A. This therefore prevents a part of the radio-absorbing and heat-dissipative gel 9 from flowing down from its original position.

Second Embodiment

The following describes one or more points of the second embodiment, which are different from the configuration of the first embodiment, because the basic configuration of the second embodiment is similar to that of the first embodiment.

There are components in the second embodiment, which are identical to corresponding components in the first embodiment. For the identical components in the second embodiment, descriptions of the corresponding components in the first embodiment are employed.

There is no component between the protrusion portion 19 and the protrusion portion 21 in the radar apparatus 1 of the first embodiment.

Figure 4:
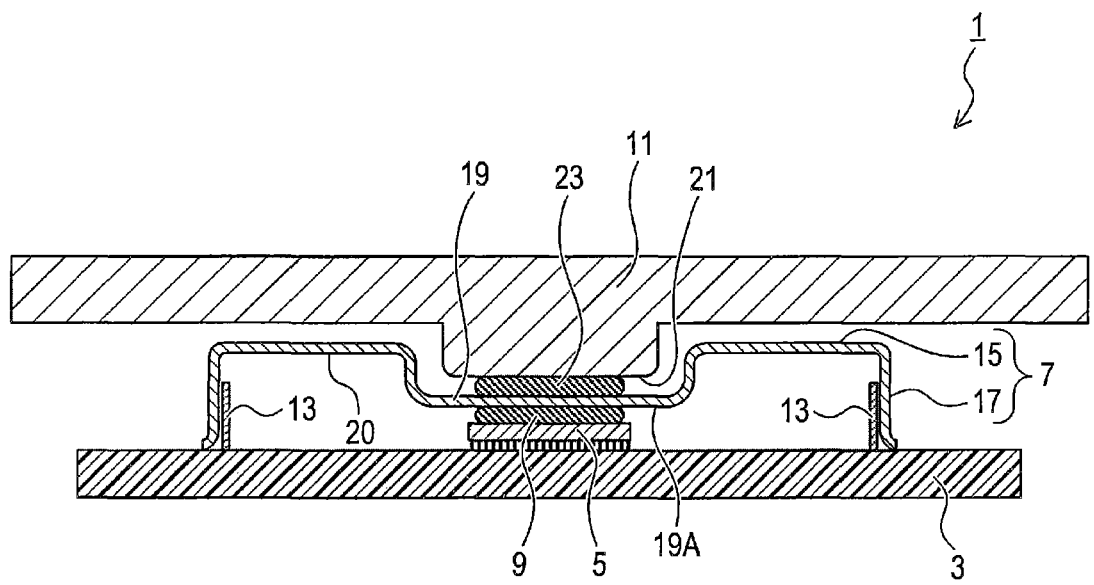
FIG. 4 is a side cross-sectional view illustrating a configuration of a radar apparatus according to the second embodiment.

In contrast, a radar apparatus 1 of the second embodiment includes, as illustrated in FIG. 4, a radio-absorbing and heat-dissipative gel 23 filled between the protrusion portion 19 and the protrusion portion 21.

The composition of the radio-absorbing and heat-dissipative gel 23 is identical to the composition of the radio-absorbing and heat-dissipative gel 9. The radio-absorbing and heat-dissipative gel 23 serves as a heat dissipation gel. The radio-absorbing and heat-dissipative gel 23 is located to be in contact with both the protrusion portion 19 and the protrusion portion 21. The radio-absorbing and heat-dissipative gel 23 is arranged to be overlapped with the protrusion portions 19 and 21, the radio-absorbing and heat-dissipative gel 9, and the MMIC 5 as viewed in the thickness direction of the board 3. A heat dissipation gel, which has a lower function of absorbing radio waves, can be used in place of the radio-absorbing and heat-dissipative gel 23. The heat dissipation gel, which has a lower function of absorbing radio waves, is equivalent in heat dissipation to the radio-absorbing and heat-dissipative gel 9.

The radio-absorbing and heat-dissipative gel 23 has the thickness of, for example, larger than or equal to 0.1 mm and smaller than or equal to 2.0 mm. For example, coating the mixture of materials constituting the radio-absorbing and heat-dissipative gel 23 on the protrusion portion 19 or 21 enables the radio-absorbing and heat-dissipative gel 23 to be formed between the protrusion portions 19 and 21.

The radar apparatus 1 according to the second embodiment configured set forth above achieves the following advantageous benefit in addition to the above advantageous effects of the radar apparatus 1 according to the first embodiment.

The radar apparatus 1 according to the second embodiment includes the radio-absorbing and heat-dissipative gel 23 filled between the shielding case 7 and the metallic housing 11. The radio-absorbing and heat-dissipative gel 23 is configured to dissipate heat of the shielding case 7 to the metallic housing 11, making it possible for the radar apparatus 1 to more efficiently dissipate heat generated from the MMIC 5.

Third Embodiment

The following describes one or more points of the third embodiment, which are different from the configuration of the first embodiment, because the basic configuration of the third embodiment is similar to that of the first embodiment.

There are components in the third embodiment, which are identical to corresponding components in the first embodiment. For the identical components in the third embodiment, descriptions of the corresponding components in the first embodiment are employed.

No members are mounted to the periphery 20 according to the first embodiment.

Figure 5:
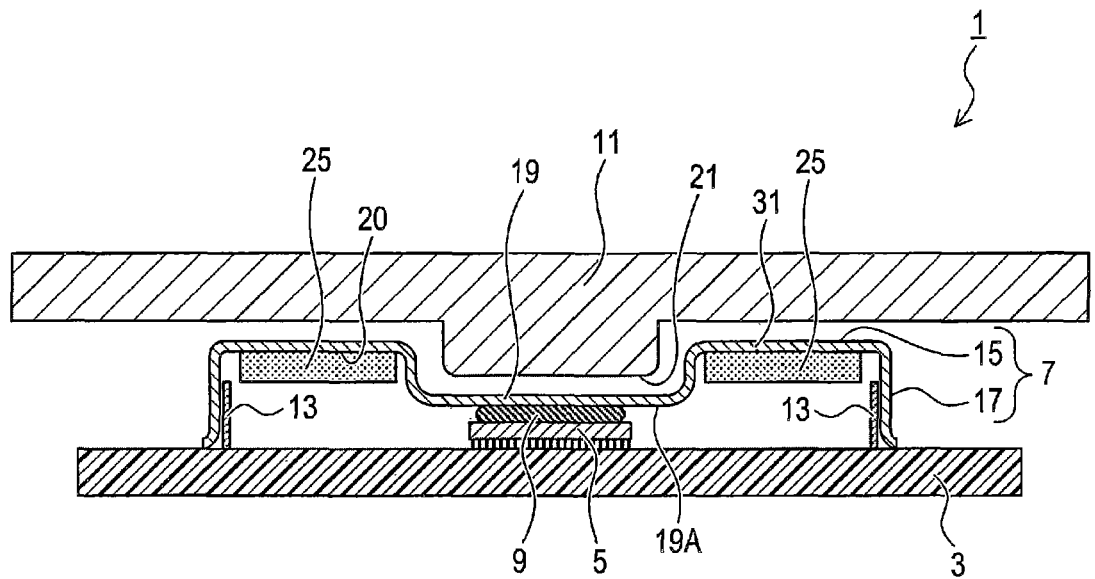
FIG. 5 is a side cross-sectional view illustrating a configuration of a radar apparatus according to the third embodiment.
Figure 6:
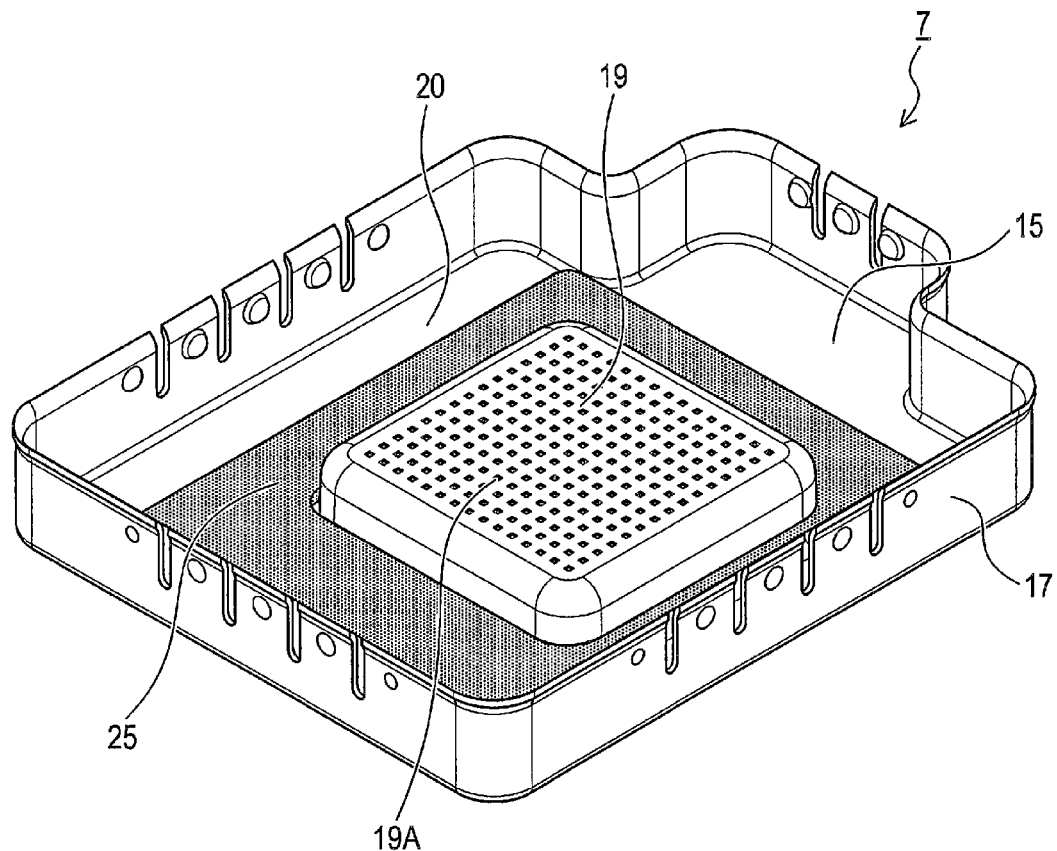
FIG. 6 is a perspective view illustrating a configuration of a shielding case as viewed from a side where a board is disposed.
Figure 7:
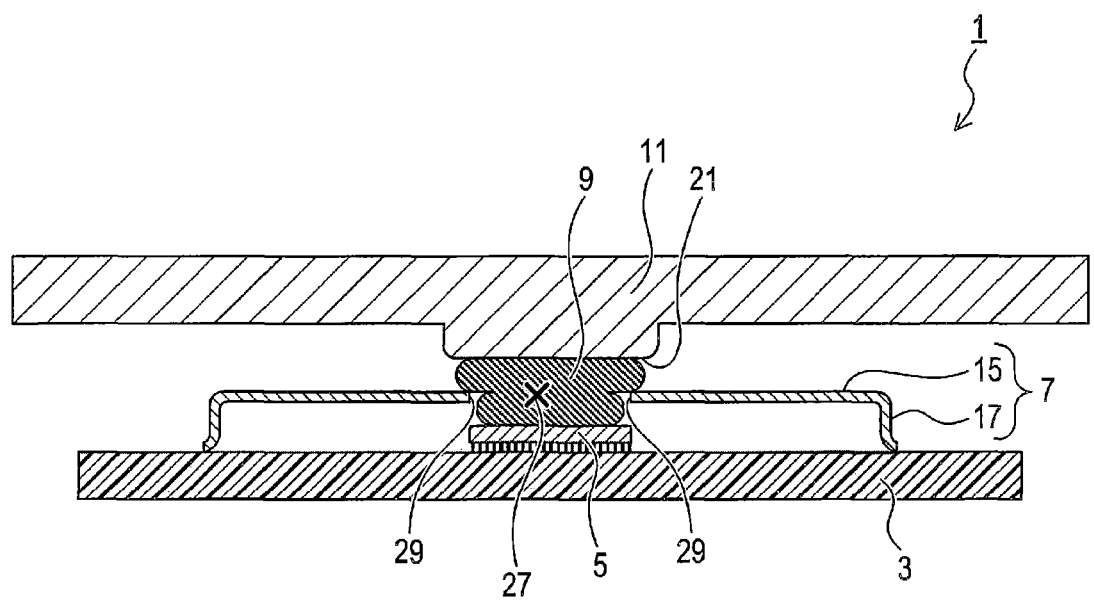
FIG. 7 is a side cross-sectional view illustrating a configuration of a radar apparatus according to the fourth embodiment.

In contrast, a radar apparatus 1 according to the third embodiment includes a radio-wave absorber 25 mounted on an inner surface of the periphery 20 as illustrated in FIGS. 5 and 6.

Referring to FIG. 6, the radio-wave absorber 25 is mounted on the inner surface of the periphery 20 to surround the protrusion portion 19. In particular, the radio-wave absorber 25 is arranged to surround the MMIC 5 as viewed in the thickness direction of the board 3.

The radio-wave absorber 25 is comprised of, for example, a radio-wave absorption filler.

The radio-wave absorption filler is composed of, for example, a magnetic powder, such as a ferrite powder, a carbonyl iron powder, a magnetic metallic powder having a flat shape, or another material powder. The radio-wave absorption member can be composed of one type of material or a mixture of several types of material.

The radio-wave absorber 25 is configured to absorb radio waves generated from the MMIC 5.

The radar apparatus 1 according to the third embodiment configured set forth above achieves the following advantageous benefit in addition to the above advantageous effects of the radar apparatus 1 according to the first embodiment.

The radar apparatus 1 according to the third embodiment includes the radio-wave absorber 25 mounted on the inner surface of the shielding case 7. The radio-wave absorber 25 is configured to absorb radio waves generated from the MMIC 5, making it possible for the radar apparatus 1 to more efficiently reduce the noise floor due to the MMIC 5.

Fourth Embodiment

The following describes one or more points of the fourth embodiment, which are different from the configuration of the first embodiment, because the basic configuration of the fourth embodiment is similar to that of the first embodiment.

There are components in the fourth embodiment, which are identical to corresponding components in the first embodiment. For the identical components in the fourth embodiment, descriptions of the corresponding components in the first embodiment are employed.

The radio-absorbing and heat-dissipative gel 9 according to the first embodiment is filled between the MMIC 5 and the shielding case 7.

In contrast, a shielding case 7 of a radar apparatus 1 according to the fourth embodiment has an opening 27 located to face the MMIC 5. The opening 27 is located at the center of the top wall 15. The opening 27 is a hole formed through the top wall 15.

The radio-absorbing and heat-dissipative gel 9 is filled between the MMIC 5 and the metallic housing 11, and is in contact with both the MMIC 5 and the metallic housing 11. Specifically, the radio-absorbing and heat-dissipative gel 9 is arranged such that the radio-absorbing and heat-dissipative gel 9 is arranged such that a part of the radio-absorbing and heat-dissipative gel 9 is located within the opening 27. The radio-absorbing and heat-dissipative gel 9 extends to abut an inner edge 29 of the opening 27.

The radar apparatus 1 according to the fourth embodiment configured set forth above achieves the following advantageous benefits in addition to the above advantageous effects of the radar apparatus 1 according to the first embodiment.

The radio-absorbing and heat-dissipative gel 9 according to the fourth embodiment is arranged to be in contact with the metallic housing 11 in addition to the MMIC 5 and the shielding case 7. This arrangement enables heat generated from the MMIC 5 to be transferred to the shielding case 7 and the metallic housing 11 through the radio-absorbing and heat-dissipative gel 9. This therefore makes it possible for the radar apparatus 1 to more efficiently dissipate heat generated from the MMIC 5 through the radio-absorbing and heat-dissipative gel 9.

The fourth embodiment includes the radio-absorbing and heat-dissipative gel 9 without including both the radio-absorbing and heat-dissipative gels 9 and 23 according to the second embodiment. The fourth embodiment therefore simplifies a step of arranging a radio-absorbing and heat-dissipative gel between the shielding case 7 and the MMIC 5 included in a method of manufacturing the radar apparatus 1. This results in a lower cost of manufacturing the radar apparatus 1.

MODIFICATIONS

The embodiments of the present disclosure have been described, but the present disclosure is not limited to the embodiments, and can be implemented with various modifications.

The radar apparatus 1 of each embodiment includes the MMIC 5, but the present disclosure is not limited thereto. Specifically, the radar apparatus 1 can include another type of high-frequency IC except for the MMIC 5.

The functions of one element in each embodiment can be implemented by plural elements, and the functions that plural elements have can be implemented by one element. The functions of elements in each embodiment can be implemented by one element, and one function that plural elements carry out can be implemented by one element. At least part of the structure of each embodiment can be eliminated. At least part of each embodiment can be added to the structure of another embodiment, or can be replaced with a corresponding part of another embodiment.

The present disclosure can be implemented by various embodiments in addition to the radar apparatus 1; the various embodiments include systems each include the radar apparatus 1, and methods of manufacturing the radar apparatus 1.

What is claimed is:

1. A radar apparatus comprising:
    a board;
    a high-frequency integrated circuit mounted to the board;
    a shielding case configured to enclose the high-frequency integrated circuit, the high-frequency integrated circuit having a surface that faces the shielding case;
    a radio-absorbing and heat-dissipative gel arranged to cover at least part of the high-frequency integrated circuit and to be in contact with the shielding case; and
    a metallic housing located outside the shielding case,
    wherein
    at least part of the radio-absorbing and heat-dissipative gel being in contact with the surface of the high-frequency integrated circuit, and
    the radio-absorbing and heat-dissipative gel being arranged to directly transfer heat generated from the high-frequency integrated circuit to the shielding case.

2. The radar apparatus according to claim 1, wherein:
    the shielding case has a protrusion portion arranged to face the high-frequency integrated circuit, the protrusion portion being configured to protrude toward the high-frequency integrated circuit; and
    the radio-absorbing and heat-dissipative gel is arranged to be in contact with the protrusion portion.

3. The radar apparatus according to claim 2, wherein:
    the protrusion portion of the shielding case has a gel contact surface that is in contact with the radio-absorbing and heat-dissipative gel; and
    the gel contact surface has a level of surface roughness that is more than or equal to 10 and less than or equal to 1000.

4. The radar apparatus according to claim 2, wherein:
    the radio-absorbing and heat dissipation gel is filled between the shielding case and the metallic housing.

5. The radar apparatus according to claim 1, wherein:
    a protrusion portion of the shielding case has a gel contact surface that is in contact with the radio-absorbing and heat-dissipative gel; and
    the gel contact surface has a level of surface roughness that is more than or equal to 10 and less than or equal to 1000.

6. The radar apparatus according to claim 5, wherein:
    the radio-absorbing and heat dissipation gel is filled between the shielding case and the metallic housing.

7. The radar apparatus according to claim 1, wherein:
    the radio-absorbing and heat dissipation gel is filled between the shielding case and the metallic housing.

8. The radar apparatus according to claim 1, further comprising:
    a radio-wave absorber mounted on an inner surface of the shielding case.

9. The radar apparatus according to claim 1, wherein:
    the shielding case has an opening arranged to face the high-frequency integrated circuit; and
    the radio-absorbing and heat-dissipative gel is filled between the high-frequency integrated circuit and the metallic housing, and is arranged to abut an inner edge of the opening.

10. The radar apparatus according to claim 1, wherein:
the metallic housing is located across the shielding case.

\* \* \* \* \*